United States Patent [19]
Yamamoto et al.

[11] Patent Number: 5,878,331
[45] Date of Patent: Mar. 2, 1999

[54] INTEGRATED CIRCUIT

[75] Inventors: Kazuya Yamamoto; Kosei Maemura, both of Tokyo, Japan

[73] Assignee: Mitsubishi Denki Kabushiki Kaisha, Tokyo, Japan

[21] Appl. No.: 689,085

[22] Filed: Jul. 30, 1996

[30] Foreign Application Priority Data

Jan. 22, 1996 [JP] Japan ................................. 8-008046

[51] Int. Cl.$^6$ .............................. H04B 1/44; H04L 5/14; H03G 3/30

[52] U.S. Cl. ................................ 455/83; 455/78; 455/79; 455/80; 455/81; 455/269; 455/281; 330/277; 330/130; 333/18; 333/17.1; 333/81

[58] Field of Search ................................ 455/78, 79, 80, 455/81, 83, 269, 281, 283, 106, 249.1, 252.1, 116, 82, 126, 127, 527; 333/17.1, 18, 104, 103, 262, 81; 330/277, 296, 136, 130

[56] References Cited

U.S. PATENT DOCUMENTS

| | | | |
|---|---|---|---|
| 4,810,911 | 3/1989 | Noguchi ................................. | 333/104 |
| 5,475,875 | 12/1995 | Katsuyama et al. ...................... | 455/78 |
| 5,477,532 | 12/1995 | Hoshigami et al. ...................... | 455/83 |
| 5,548,239 | 8/1996 | Kohama et al. .......................... | 455/83 |
| 5,559,471 | 9/1996 | Black ...................................... | 330/277 |
| 5,589,796 | 12/1996 | Alberth, Jr. et al. .................... | 330/133 |
| 5,634,200 | 5/1997 | Kitakubo et al. ......................... | 455/82 |
| 5,659,885 | 8/1997 | McDonald et al. ....................... | 455/78 |
| 5,689,817 | 11/1997 | Fok ......................................... | 455/79 |
| 5,771,470 | 6/1998 | Nimmo et al. ........................... | 455/572 |

FOREIGN PATENT DOCUMENTS

| | | |
|---|---|---|
| 0625831 | 11/1994 | European Pat. Off. . |
| 3203961 | 8/1983 | Germany . |
| 4344333 | 7/1994 | Germany . |
| 4421259 | 12/1994 | Germany . |

OTHER PUBLICATIONS

"3V Single Bias Operating SPDT T/R MMIC Switches for PHP Using the Symmetrical MESFETs"; Technical Report of the Institute of Electronics, Information and Communication Engineers, NO. MW93–157, Feb. 1994.

"A 3V MMIC Chip Set for 1.9GHz Mobile Communication Systems"; 1995 IEEE International Solid–State Circuits Conference, Feb. 16, 1995.

Primary Examiner—Tommy P. Chin
Assistant Examiner—Anand S. Rao
Attorney, Agent, or Firm—Leydig, Voit & Mayer

[57] ABSTRACT

An integrated circuit includes a single pole double throw switch including a transmitting and receiving port, a transmitting port, and a receiving port. A transmission switch is coupled between the transmitting port and the transmitting and receiving port. A reception switch is coupled between the receiving port and the transmitting and receiving port. The reception switch includes a field effect transistor having a gate, a drain and a source. A voltage generating circuit receives first and second power supply voltages. The first power supply voltage is greater than the second power supply voltage. The voltage generating circuit generates a third voltage lower than the second power supply voltage and applies the third voltage to the gate of the field effect transistor of the reception switch during transmission. As a result, the magnitude of the voltage difference between the gate and the source or the gate and the drain of the second field effect transistor is greater than the magnitude of the difference between the first and second power supply voltages. Accordingly, because of the increased electrical separation between the terminals of the field effect transistor, leakage current flowing to the receiving port during transmission is reduced.

8 Claims, 12 Drawing Sheets

INTEGRATED CIRCUIT

FIELD OF THE INVENTION

The present invention relates to an integrated circuit (hereinafter referred to as IC) employed in a communication apparatus in which a transmitter and a receiver form a structural unit, for example, a transceiver or a portable telephone.

BACKGROUND OF THE INVENTION

In recent years, with the spread of small-sized portable telephones, mobile communications utilizing analog or digital modulation systems have been developed. In a small-sized portable telephone, a reduction in chip size and an increase in integration density of functional elements are very important.

Especially, a GaAs IC chip, i.e., an IC chip employing a GaAs substrate, used in an RF front end part is backward in integration compared with IC chips used in other parts. So, an increase in the integration density of the GaAs IC chip and a reduction in the chip size have been strongly demanded.

FIG. 13 is a block diagram schematically illustrating a structure of an RF front end part of a conventional portable telephone. In the figure, reference numerals 8a and 8b designate mixers, i.e., frequency changers (hereinafter referred to as MIX), numeral 1 designates a variable attenuator for transmission (hereinafter referred to as TX-ATT), numeral 6 designates a variable attenuator for reception (hereinafter referred to as RX-ATT), numeral 2 designates a power amplifier (hereinafter referred to as PA) using a GaAs field effect transistor (hereinafter referred to as FET), numeral 3a designates a band pass filter (hereinafter referred to as BPF), and numeral 4 designates a single pole double throw switch (hereinafter referred to as SPDT-SW). The SPDT-SW 4 has three terminals, and a signal input to one of the three terminals is selectively output from the remaining two terminals. Reference numeral 7 designates a low noise amplifier for reception (hereinafter referred to as LNA). Reference numeral 9 designates a negative voltage generator (hereinafter referred to as NVG) for supplying a negative voltage $V_{GB}$ to the PA 2 because the PA 2 comprising a GaAs FET needs a negative gate bias voltage. Reference numeral 10 designates a control logic circuit for controlling the TX-ATT 1, the RX-ATT 6, and the SPDT-SW 4 in response to a control signal CONT. Since a single power supply voltage $V_{DD}$ is used in this portable telephone, for a control signal output from the control logic circuit 10, the power supply voltage $V_{DD}$ is used as a high potential (hereinafter referred to as "H") and a ground voltage (hereinafter referred to as GND), i.e., 0V, is used as a low potential (hereinafter referred to as "L"). Reference numeral 11 designates a transmitted RF signal input port (hereinafter referred to as TX-IN), and numeral 14 designates a received RF signal output port (hereinafter referred to as RX-OUT). Reference numeral 5 designates an antenna port (hereinafter referred to as ANT), that is, an I/O port connected to an antenna 5a. Reference numeral 12 designates a $V_{NVG}$ input port (hereinafter referred to as $V_{NVG}$-IN) receiving a signal $V_{NVG}$ which controls an output voltage from the NVG 9. The power supply voltage $V_{DD}$ is used as $V_{NVG}$. Reference numeral 13 designates a control signal input port (hereinafter referred to as CONT-IN) receiving the control signal CONT which controls the operation of the control logic circuit 10. The control logic circuit 10 is a part of a base band IC comprising Si (not shown), and it is controlled by a control signal CONT that is output from a circuit in the base band IC other than the control logic circuit 10.

A description is given of the operation. The SPDT-SW 4 connects the ANT 5 to the TX-IN 11 during reception and connects the ANT 5 to the RX-OUT 14 during transmission, and the control circuit 10 controls the switching of the SPDT-SW 4 and controls the TX-ATT 1 and the RX-ATT 6. Further, during transmission, the NVG 9 generates a negative voltage $V_{GB}$ from a positive power supply voltage applied thereto and supplies the negative voltage $V_{GB}$ to the PA 2 as a gate bias voltage.

During transmission, an RF signal input to the TX-IN 11 is subjected to frequency conversion by the MIX 8a, and the frequency converted signal is input to the TX-ATT 1. In the TX-ATT 1, the signal is attenuated, as desired, in response to the power of the input signal. Then, the attenuated signal is amplified by the PA 2, and unnecessary frequency components are eliminated from the attenuated signal by the BPF 3a. Thereafter, the signal is transmitted through the SPDT-SW 4 and ANT 5 and output from the antenna 5a.

During reception, an RF signal received by the antenna 5a is transmitted through the ANT 5 and the SPDT-SW 4 to the RX-ATT 6. In the RX-ATT 6, it is attenuated, as desired, in response to the power of the input signal. Then, unnecessary frequency components are eliminated from the attenuated signal by the BPF 3b. Thereafter, the signal is amplified by the LNA 7 and subjected to frequency conversion by the MIX 8b. Finally, it is taken out from the RX-OUT 14.

In the circuit shown in FIG. 13, the MIXs 8a and 8b, the TX-ATT 1, the PA 2, the SPDT-SW 4, the RX-ATT 6, and the LNA 7 are integrated on a single GaAs substrate (not shown). However, the NVG 9 and the control logic circuit 10 are located outside the GaAs substrate. For example, the NVG 9 is constituted by an IC comprising an Si substrate for the IC only, and the control logic circuit 10 is constituted by a base band IC comprising an Si substrate. Therefore, the number of parts of the transceiver IC is increased, so that the fabrication process is complicated. Further, it is difficult to reduce the size of the transceiver IC.

In order to solve the above-described problems, it might be thought that all the constituents of the circuit, i.e., the MIXs 8a and 8b, the TX-ATT 1, the PA 2, the LNA 7, the SPDT-SW 4, the RX-ATT 6, the NVG 9, and the control logic circuit 10 might be integrated on a single GaAs substrate, and a switch and an attenuator having simple structures are employed. However, the integration of these constituents on a single substrate and the use of a simple switch and a simple attenuator adversely affect the transmission and reception characteristics of the switch and the attenuator as described hereinafter.

FIG. 14 is a circuit diagram illustrating a serial-parallel switch generally used as an SPDT switch in a circuit as shown in FIG. 13. In the figure, reference numerals 51, 52, 53, and 54 designate depletion type field effect transistors (hereinafter referred to as D-FETs), numerals 55, 56, 57, 58, 59, and 60 designate resistors having high resistances for bias application, numeral 61 designates a capacitor for grounding source electrodes of the FETs 52 and 54 for AC, and an end of the capacitor 61 is grounded. Reference numeral 62 designates a transmission side input port (hereinafter referred to as SW-TX), numeral 63 designates a reception side output port (hereinafter referred to as SW-RX), numeral 5 designates an antenna port, and numerals 64 and 65 designate control signal input ports. The control signal input ports 64 and 65 are connected to the control logic circuit 10 shown in FIG. 13 and receive control signals from the control logic circuit 10. The control signal input to the control signal input port 64 is an inverted signal, i.e., a signal opposite to the control signal input to the control signal input port 65. For the control signal, as described above, the power supply voltage $V_{DD}$ is used as "H" and the ground voltage, i.e., 0V, is used as "L". Reference numeral 66 designates a supply voltage port for raising potentials of transmission lines, i.e., potentials of sources and drains of the transistors 51 and 53, to operate the transistors 51 and 53, in response to the power supply voltage $V_{DD}$ and the ground voltage applied to the control signal input ports 64 and 65.

A description is given of the operation. During transmission, "H" ($\approx V_{DD}$) is applied to the control signal input port 64 while "L" ($\approx$0V) is applied to the control signal input port 65, whereby the FETs 52 and 53 are turned on and the FETs 51 and 54 are turned off, and an RF signal input to the SW-TX 62 is output from the ANT 5. At this time, since the FET 51 is in the OFF state, no RF signal is output from the SW-RX 63. Even when the signal leaks from the FET 51, the leakage signal is reflected because the FET 52 is in the ON state, and leakage of a signal from the SW-RX 63 is suppressed.

At the reception, "H" ($\approx V_{DD}$) is applied to the control signal input port 65 while "L" ($\approx$0V) is applied to the control signal input port 64, whereby the FETs 51 and 54 are turned on and the FETs 52 and 53 are turned off, and an RF signal input to the antenna port 5 is output from the reception side RF signal output port 63. At this time, since the FET 53 is in the OFF state, no RF signal is output from the SW-TX 62. Even when the signal leaks from the FET 53, the leakage signal is reflected because the FET 54 is in the ON state, and leakage of a signal from the SW-TX 62 is suppressed.

The serial-parallel SPDT switch shown in FIG. 14 has the advantage of reduced insertion loss and high isolation. Recently, an SPDT switch that can treat a high output voltage at transmission ranging from 24 dBm to 30 dBm, at a low operating voltage, for example, a control voltage of 3/0 V or 0/–3 V, has been realized by using an FET having two different pinch-off voltages or a dual gate FET. Such an SPDT switch is reported in "3V Single Bias Operating SPDT T/R MMIC Switches for PHP Using the Symmetrical MESFETs", TECHNICAL REPORT OF THE INSTITUTE OF ELECTRONICS, INFORMATION AND COMMUNICATION ENGINEERS, No. MW93–157 (February, 1994) or in "A 3V MMIC Chip Set for 1.9 GHz Mobile Communication Systems", 1995 IEEE International Solid-State Circuits Conference.

However, since a serial-parallel SPDT switch as disclosed in these publications is usually as large as 1×1 mm, when the serial-parallel SPDT switch is used in an IC, the chip size of the IC is unfavorably increased.

Furthermore, in order to realize a single power supply operation between $V_{DD}$ and GND (0V), it is necessary to make the circuit open for DC and shorted for AC using the capacitor 61. For this purpose, however, a capacitance over ten pF is required for GHz band operation, and an element having such a high capacitance is large in size, resulting in an unwanted increase in the chip size.

FIG. 12 is a circuit diagram illustrating an SPDT switch that can solve the problems mentioned above. This SPDT switch has a relatively simple structure, i.e., the number of FETs is reduced to two and no capacitor is included, thereby to reduce the size of an IC chip including this SPDT switch. In the figure, the same reference numerals as those shown in FIG. 10 designate the same or corresponding parts. Reference numeral 4a designates an SPDT switch, numerals 70 and 71 designate D-FETs, numerals 72, 73, 74, and 75 designate resistors for bias application, and numeral 76 designates a resistor for raising potentials of transmission lines, i.e., potentials of sources and drains of the transistors 51 and 53, in response to the power supply voltage $V_{DD}$.

A description is given of the operation. During transmission, "H" ($\approx V_{DD}$) is applied to the control signal input port 64 and "L" ($\approx$0V) is applied to the control signal input port 65, whereby the FET 70 is turned on and the FET 71 is turned off, and an RF signal input to the SW-TX 62 is output from the antenna port 5. Since the FET 71 is in the OFF state, no RF signal is output from the SX-RX 63.

During reception, "H" ($\approx V_{DD}$) is applied to the control signal input port 65 and "L" ($\approx$0V) is applied to the control signal input port 64, whereby the FET 71 is turned on and the FET 70 is turned off, and an RF signal input to the antenna port 5 is output from the SW-RX 63. Since the FET 70 is in the OFF state, no RF signal is output from the SW-TX 62.

Although an SPDT switch having such a simple structure as shown in FIG. 12 has the advantage of reducing the chip size, it has the following drawbacks.

The SPDT switch 4a shown in FIG. 12 is in the transmitting state when the FET 70 is in the ON state and the FET 71 is in the OFF state. In the transmitting mode of the SPDT switch 4a, when the gate to source voltage (gate to drain voltage) of the FET 71 is low, the OFF state of the FET 71 is not sufficient, and the pinch-off state of the FET 71 is not maintained against a high power. Thereby, signals leak at the SW-RX 63 with an increase in the power of signals input to the SW-TX 62. In recent years, a portable transceiver using a single power supply of about 3V is popular. However, when such a low power supply voltage is used, since the voltage for raising potentials of transmission lines, i.e., $V_{DD}$, is equal to 3V, a difference between the gate voltage and the source voltage (drain voltage) of the FET 71 in the OFF state is as small as –3V (=GND (0V)–$V_{DD}$ (3V)). In this case, it is impossible to sufficiently prevent signals from leaking at the SW-RX 63 when the power of signals input to the SW-TX 62 is high. As a result, insertion loss of the SPDT switch 4a is increased, and isolation between the SPDT switch 4a and the RX-ATT 6 is degraded.

As described above, in the prior art IC equipped with a simple SPDT switch for reducing the chip size and operated with a single power supply, since the power supply voltage $V_{DD}$ is used as a high potential "H" and the ground voltage (=0V) is used as a low potential "L", when it is operated with a power supply voltage as low as 3V or with a control signal of 0V, insertion loss of the SPDT switch is increased and isolation between the SPDT switch and the RX-ATT 6 is degraded when the transmission power is high.

SUMMARY OF THE INVENTION

An object of the present invention is to provide an IC that secures reduced insertion loss of an SPDT switch and improved isolation between the SPDT switch and a variable attenuator for reception even when it is operated with a low power supply voltage.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, an integrated circuit includes an SPDT switch comprising a transmitting and receiving port, a transmitting port, a receiving port, a transmission switch disposed between the transmitting port and the transmitting and receiving port, and a reception switch disposed between the receiving port and the transmitting and receiving port. The transmission switch includes a field effect transistor and makes current flow between the transmitting port and the transmitting and receiving port in response to a positive power supply voltage applied to a gate of the field effect transistor, and the reception switch includes a field effect transistor and makes current flow between the receiving port and the transmitting and receiving port in response to a positive power supply voltage applied to a gate of the field effect transistor. The IC further includes means for applying a voltage lower than the ground voltage to the gate of the field effect transistor of the reception switch when the power supply voltage is applied to the gate of the field effect transistor of the transmission switch. In this IC, a difference between the gate to source voltage and the gate to drain voltage of the field effect transistor in the reception switch in the OFF state is equal to a difference between the power supply voltage and the voltage lower than the ground voltage, i.e., it is larger than a difference between the power supply voltage and the ground voltage. Therefore, even when the power supply voltage is low, the insertion loss of the SPDT switch is reduced and the isolation between the SPDT switch and a variable attenuator for reception is improved, whereby the resistance of the IC to a high transmission power is improved.

According to a second aspect of the present invention, the above-described IC includes a reception attenuator including a field effect transistor and connected to the receiving port of the SPDT switch, the reception attenuator being in the non-attenuated state when the power supply voltage is applied to a gate of the field effect transistor and in the attenuated state when a voltage lower than the power supply voltage is applied to the gate of the transistor. The IC further includes means for applying the voltage lower than the ground voltage to the gate of the field effect transistor of the reception attenuator to make the attenuated state of the reception attenuator when the power supply voltage is applied to the gate of the field effect transistor of the transmission switch. In this IC, a difference between the gate to source voltage and the gate to drain voltage of the field effect transistor in the reception attenuator when the reception switch is in the OFF state is equal to a difference between the power supply voltage and the voltage lower than the ground voltage, i.e., it is larger than a difference between the power supply voltage and the ground voltage. Therefore, even when the power supply voltage is low, the isolation between the SPDT switch and the reception attenuator is improved.

According to a third aspect of the present invention, an integrated circuit includes an SPDT switch comprising a transmitting and receiving port, a transmitting port, a receiving port, a transmission switch disposed between the transmitting port and the transmitting and receiving port, and a reception switch disposed between the receiving port and the transmitting and receiving port. The transmission switch includes a field effect transistor and makes current flow between the transmitting port and the transmitting and receiving port in response to a positive power supply voltage applied to the gate of the field effect transistor, and the reception switch includes a field effect transistor and makes current flow between the receiving port and the transmitting and receiving port in response to a positive power supply voltage applied to the gate of the field effect transistor. This IC further includes means for applying the ground voltage to the gate of the field effect transistor of the reception switch and applying a voltage higher than the power supply voltage to a source and a drain of the field effect transistor of the reception switch when the field effect transistor of the transmission switch is conducted. In this IC, a difference between the gate to source voltage and the gate to drain voltage of the field effect transistor in the reception switch in the OFF state is equal to a difference between the voltage higher than the power supply voltage and the ground voltage, i.e., it is larger than a difference between the power supply voltage and the ground voltage. Therefore, even when the power supply voltage is low, the insertion loss of the SPDT switch is reduced and the isolation between the SPDT switch and a variable attenuator for reception is improved, whereby the resistance of the IC to a high transmission power is improved.

According to a fourth aspect of the present invention, an integrated circuit includes an SPDT switch comprising a transmitting and receiving port, a transmitting port, a receiving port, a transmission switch disposed between the transmitting port and the transmitting and receiving port, and a reception switch disposed between the receiving port and the transmitting and receiving port. The transmission switch includes a field effect transistor and makes current flow between the transmitting port and the transmitting and receiving port in response to a positive power supply voltage applied to the gate of the field effect transistor, and the reception switch includes a field effect transistor and makes current flow between the receiving port and the transmitting and receiving port in response to a positive power supply voltage applied to the gate of the field effect transistor. This IC further includes means for applying a voltage lower than the ground voltage to the gate of the field effect transistor of the reception switch and applying a voltage higher than the power supply voltage to a source and a drain of the field effect transistor of the reception switch when the field effect transistor of the transmission switch is conducted. In this IC, a difference between the gate to source voltage and the gate to drain voltage of the field effect transistor in the reception switch in the OFF state is equal to a difference between the voltage higher than the power supply voltage and the voltage lower than the ground voltage, i.e., it is larger than a difference between the power supply voltage and the ground voltage. Therefore, even when the power supply voltage is low, the insertion loss of the SPDT switch is reduced and the isolation between the SPDT switch and a variable attenuator for reception is improved, whereby the resistance of the IC to a high transmission power is improved.

DETAILED DESCRIPTION OF THE PREFERRED EMBODIMENTS

[Embodiment 1]

Figure 1:
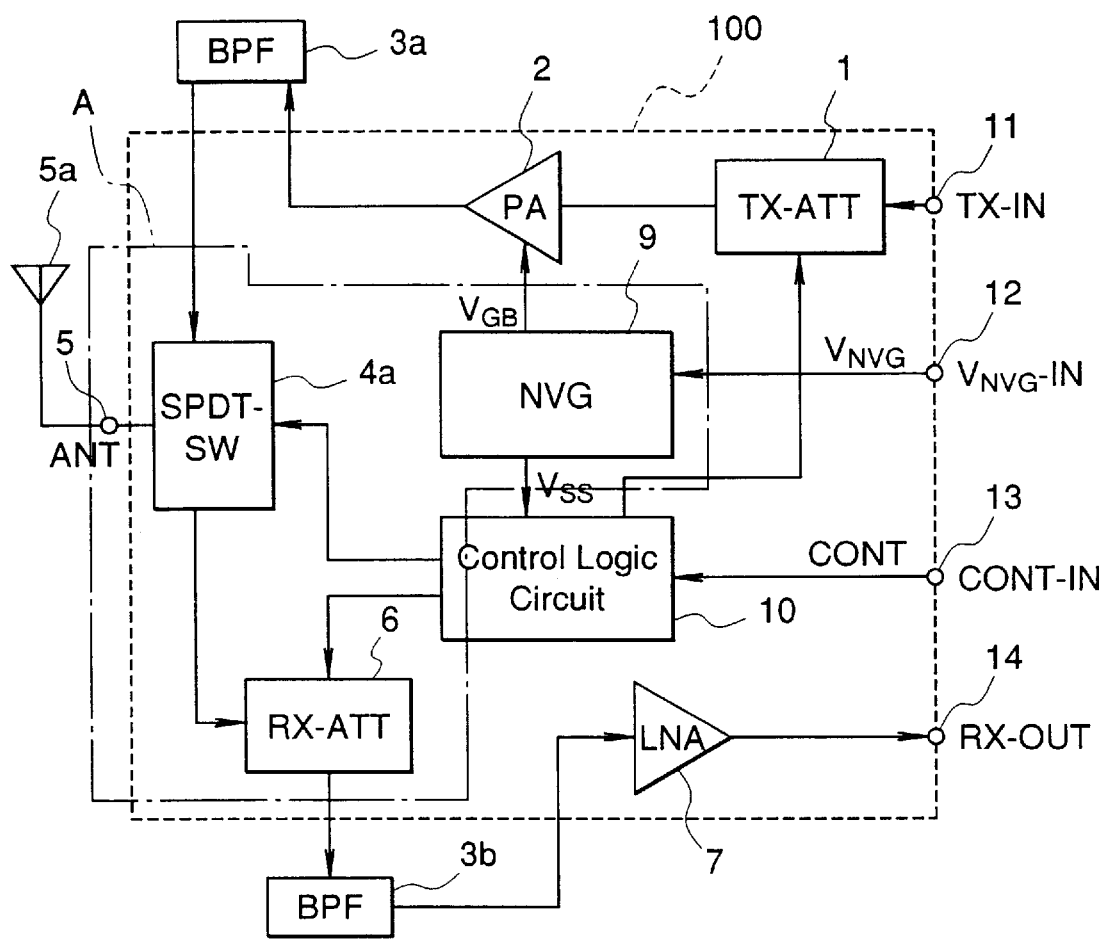
FIG. 1 is a block diagram illustrating a structure of an IC according to a first embodiment of the present invention.

FIG. 1 is a block diagram schematically illustrating an IC in accordance with a first embodiment of the present invention. In the figure, reference numeral 100 designates an IC fabricated on a substrate. The IC 100 includes a variable attenuator 1 for transmission (hereinafter referred to as TX-ATT), a variable attenuator 6 for reception (hereinafter referred to as RX-ATT), a power amplifier comprising a GaAs FET 2 (hereinafter referred to as PA), an SPDT switch 4a (hereinafter referred to as SPDT-SW), a low-noise amplifier 7 for reception (hereinafter referred to as LNA), a control logic circuit 10 for controlling the TX-ATT 1, the RX-ATT 6, and the SPDT-SW 4a in response to a control signal CONT, and a negative voltage generator 9 (hereinafter referred to as NVG) for supplying a negative gate bias voltage $V_{GB}$ to the PA 2 comprising a GaAs FET. In this first embodiment, a negative voltage $V_{SS}$ which is generated in the middle of the generation of the negative voltage $V_{GB}$ in the NVG 9 is applied to the control logic circuit 10. The IC 100 further comprises a transmitted RF signal input port 11 (hereinafter referred to as TX-IN), a received RF signal output port 14 (hereinafter referred to as RX-OUT), an antenna port 5 (hereinafter referred to as ANT) connected to an antenna 5a located outside the IC 100, an $V_{NVG}$ input port 12 (hereinafter referred to as $V_{NVG}$-IN) receiving a positive power supply voltage $V_{NVG}$ for controlling an output voltage from the NVG 9, and a control signal input port 13 (hereinafter referred to as CONT-IN) receiving the control signal CONT for controlling the control logic circuit 10. As the positive power supply voltage $V_{NVG}$, a power supply voltage $V_{DD}$ supplied to the IC 100 is used. The control signal CONT is supplied from a base band IC (not shown) located outside the IC 100. Reference numerals 3a and 3b designate band-pass filters (hereinafter referred to as BPFs) located outside the IC 100.

Figure 2:
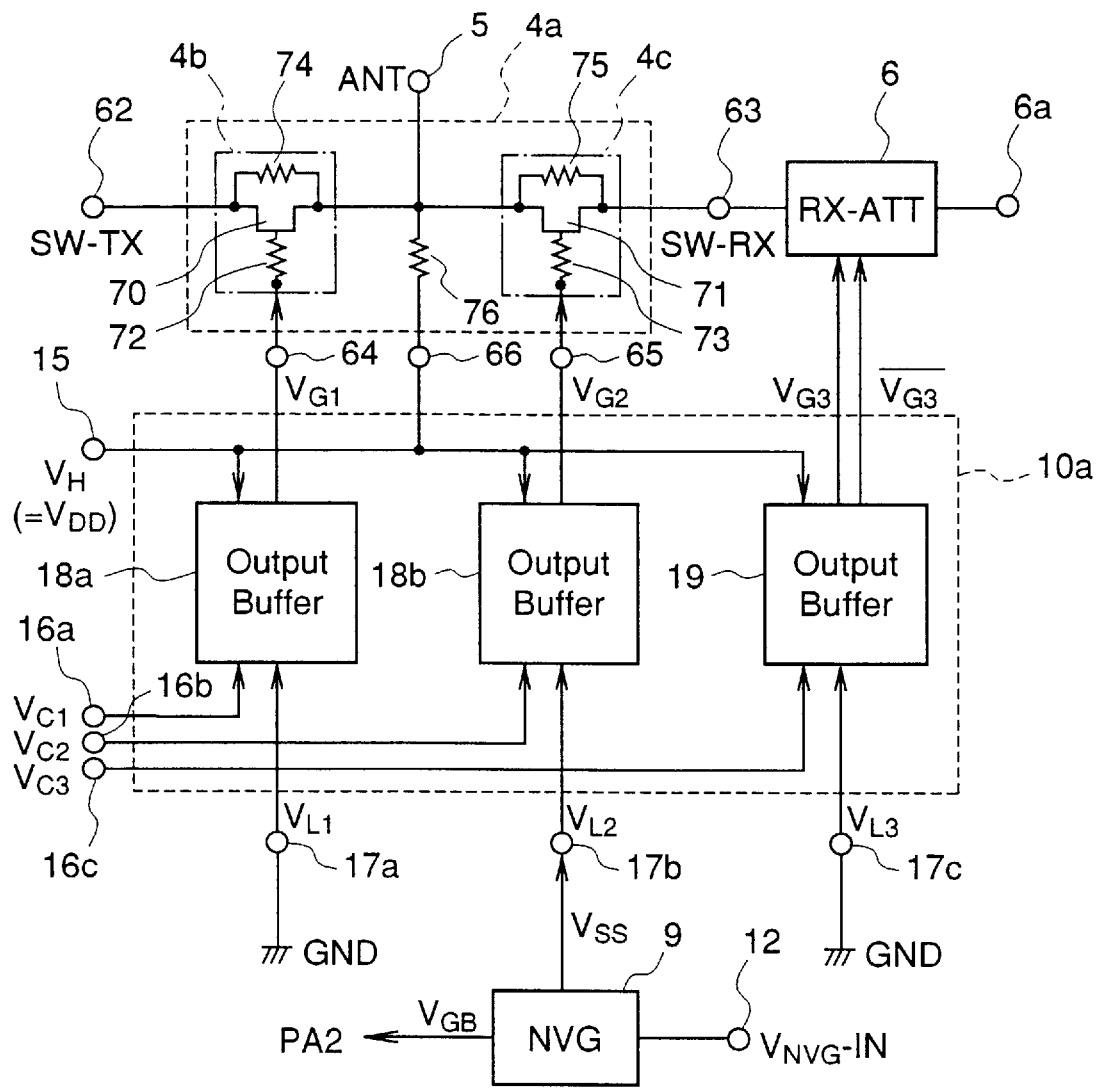
FIG. 2 is a block diagram illustrating a part of the IC according to the first embodiment of the invention.

FIG. 2 is a block diagram illustrating a part of the IC 100, denoted by A in FIG. 1. More specifically, FIG. 2 shows the SPDT-SW 4a, the RX-ATT 6, an interface part of the control logic circuit 10, and the NVG 9. In the figure, the same reference numerals as those shown in FIG. 1 designate the same or corresponding parts. The SPDT-SW 4a comprises a transmission side switch section 4b and a reception side switch section 4c. The transmission side switch section 4b comprises a depletion type field effect transistor (hereinafter referred to as D-FET) 70 and resistors 72 and 74 for bias application, and the reception side switch section 4c comprises a D-FET 71 and resistors 73 and 75 for bias application. A resistor 76 for raising potentials of transmission lines, i.e., potentials of sources and drains of the D-FETs 70 and 71, in response to the power supply voltage $V_{DD}$ is disposed between the D-FETs 70 and 71. Further, the SPDT-SW 4a comprises a transmission side input port 62 (hereinafter referred to as SW-TX), a reception side output port 63 (hereinafter referred to as SW-RX), control signal input ports 64 and 65, and a high voltage applied port 66. Reference numeral 6a designates a signal output port of the RX-ATT 6. Reference numeral 10a designates a part of the control logic circuit 10 in the vicinity of the output, and this part 10a includes output buffers 18a and 18b for supplying control signals $V_{G1}$ and $V_{G2}$ to the control signal input port 64 and 65 of the SPDT-SW 4a, respectively, and an output buffer 19 for supplying a control signal $V_{G3}$ and an inverted signal $\overline{V_{G3}}$ to the RX-ATT 6. Further, reference numeral 15 designates a high voltage port for supplying a high voltage $V_H$ to the output buffers 18a, 18b, and 19. Since this port 15 is connected to the power supply, $V_H$ is equal to $V_{DD}$. Reference numerals 16a, 16b, and 16c designate output buffer control ports receiving control signals $V_{C1}$, $V_{C2}$, and $V_{C3}$ for controlling the output buffers 18a, 18b, and 19, respectively. These control signals $V_{C1}$, $V_{C2}$, and $V_{C3}$ are supplied from a part of the control circuit 10 other than the part 10a. Reference numerals 17a, 17b, and 17c designate low voltage ports for supplying low voltages $V_{L1}$, $V_{L2}$, and $V_{L3}$ to the output buffers 18a, 18b, and 19, respectively. Since the low voltage ports 17a and 17c are grounded, $V_{L1}$ and $V_{L3}$ are about 0V. A negative voltage $V_{SS}$ lower than 0V is supplied to the low voltage port 17b from the NVG 9.

Figure 3A:
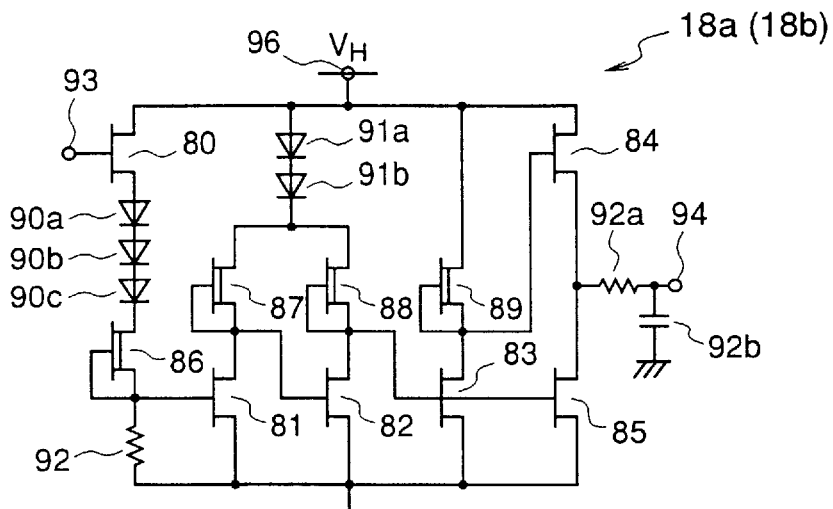
FIGS. 3($a$) and 3($b$) are circuit diagrams each illustrating a structure of an output buffer included in the IC according to the first embodiment of the invention.
Figure 3B:
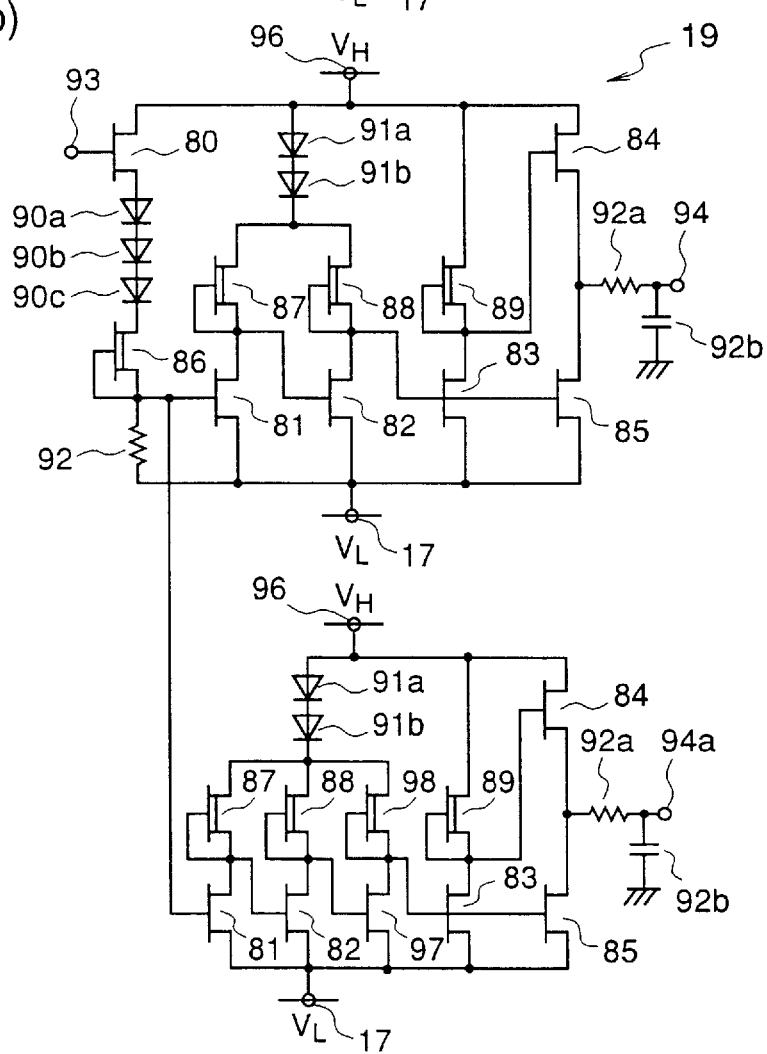

FIG. 3(a) is a circuit diagram illustrating the output buffer 18a (18b), and FIG. 3(b) is a circuit diagram illustrating the output buffer 19. In these figures, reference numerals 80, 81, 82, 83, 84, 85, and 97 designate enhancement type field effect transistors (hereinafter referred to as E-FETs), numerals 86, 87, 88, 89, and 98 designate D-FETs, numerals 90a, 90b, 90c, 91a, and 91b designate diodes, numerals 92 and 92a designate resistors, numeral 92b designates a high frequency transmitting capacitor, numeral 93 designates an output buffer control port receiving the output buffer control signals $V_{C1}$, $V_{C2}$, and $V_{C3}$, numeral 94 designates a control signal output port outputting the control signals $V_{G1}$, $V_{G2}$, and $V_{G3}$ toward the SPDT-SW 4a and the RX-ATT 6, and numeral 96 designates a high voltage port connected to the high voltage port 15 and receiving the high voltage $V_H$. Further, reference numeral 17 designates a low voltage port for supplying the low voltages $V_{L1}$, $V_{L2}$, and $V_{L3}$. This low voltage port 17 corresponds to the low voltage ports 17a, 17b, and 17c shown in FIG. 2. Reference numeral 94a designates a control signal output port outputting the inverted signal $\overline{V_{G3}}$ toward the RX-ATT 6.

Figure 4:
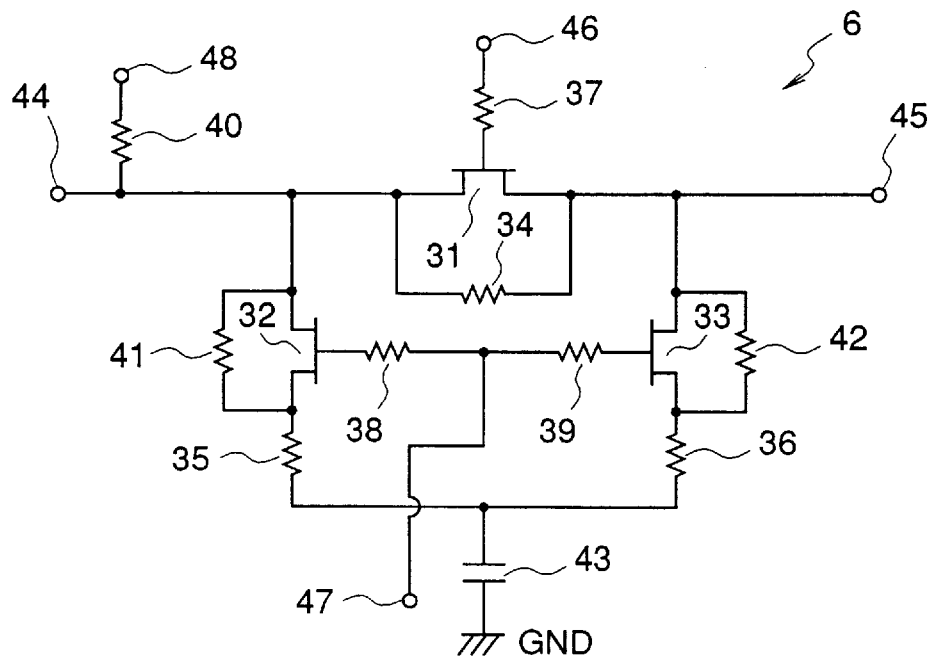
FIG. 4 is a circuit diagram illustrating a variable attenuator for reception included in the IC according to the first embodiment of the invention.

FIG. 4 is a circuit diagram illustrating a π step switching attenuator as an example of the TX-ATT 1 and the RX-ATT 6 shown in FIG. 1. In the figure, reference numerals 31, 32, and 33 designate D-FETs, numerals 34, 35, and 36 designate resistors for deciding the amount of attenuation, numerals 37, 38, 39, 40, 41, and 42 designate resistors for bias application, numeral 44 designates a signal input port, numeral 45 designates a signal output port, and numerals 46 and 47 designate control signal input ports. The control signal input ports 46 and 47 are connected to the output buffer 19 of the control logic circuit 10 shown in FIG. 2 and receive the control signal $V_{G3}$ and the inverted signal $\overline{V_{G3}}$ from the control logic circuit 10. Reference numeral 48 designates a supply voltage port for supplying the power supply voltage $V_{DD}$, and numeral 43 designates a capacitor for alternatingly grounding the FET 32 and the FET 33 via the resistor 36.

Figure 5:
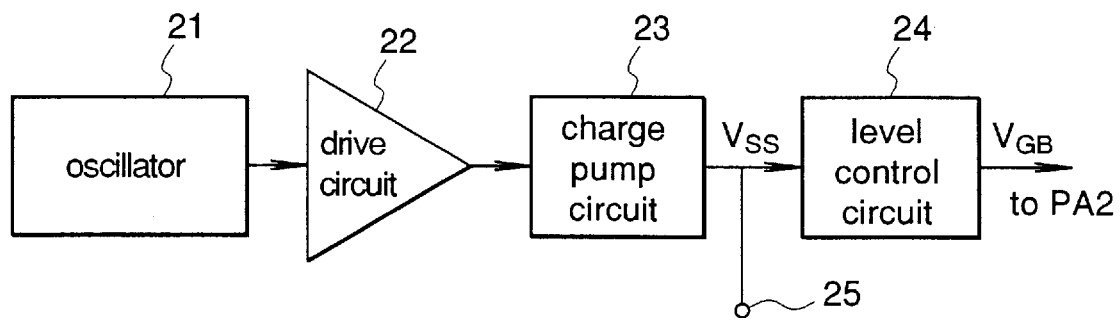
FIG. 5 is a block diagram illustrating a structure of a negative voltage generator included in the IC according to the first embodiment of the invention.

FIG. 5 is a block diagram illustrating a typical structure of the negative voltage generator 9. In the figure, the same reference numerals as those shown in FIG. 1 designate the same or corresponding parts. Reference numeral 21 designates an oscillator. In place of the oscillator 21, a buffer for transmitting a small signal from an external circuit to the next stage may be used. Reference numeral 22 designates a drive circuit for amplifying an output from the oscillator 21 to an appropriate output amplitude, numeral 23 designates a charge pump circuit for converting a positive voltage $V_{NVG}$ input to the negative voltage generator 9 to a negative voltage $V_{SS}$, numeral 24 designates a level control circuit for level-converting the negative voltage $V_{SS}$ to an appropriate gate bias voltage $V_{GB}$ ($V_{SS} < V_{GB} < 0V$), and numeral 25 designates a $V_{SS}$ output port for taking the negative voltage $V_{SS}$ from the charge pump 23. The output port 25 is connected to the low voltage port 17b of the output buffer 18b of the control logic circuit 10. This negative voltage generator 9 constitutes a charge pump system DC—DC converter.

Figure 6:
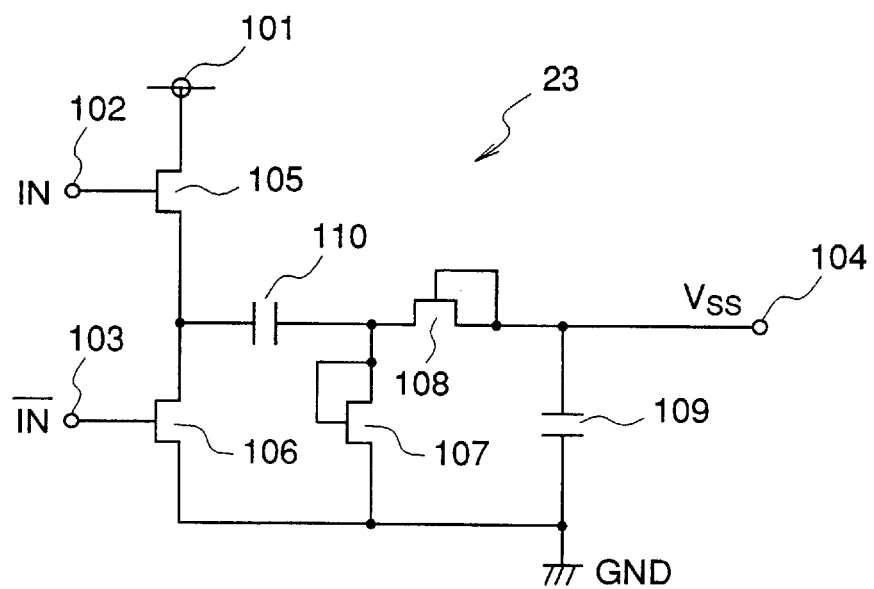
FIG. 6 is a circuit diagram illustrating a structure of a charge pump circuit included in the IC according to the first embodiment of the invention.

FIG. 6 is a circuit diagram illustrating the charge pump circuit 23 shown in FIG. 5. In the figure, reference numerals 102 and 103 designate input ports connected to the drive circuit 5. The input ports 102 and 103 receive a signal IN and an inverted signal $\overline{IN}$, respectively. Reference numerals 105, 106, 107, and 108 designate E-FETs, numeral 109 designates a capacitor, numeral 101 designates a supply voltage port receiving the power supply voltage $V_{DD}$, and numeral 104 designates a negative voltage output port outputting the negative voltage $V_{SS}$.

A description is given of the operation of the IC according to the first embodiment of the invention. During transmission, the SPDT-SW 4a connects the ANT 5 to the TX-IN 11, and an RF signal input to the TX-IN 11 is subjected to frequency conversion in a frequency converter (not shown), and applied to the TX-ATT 1. In the TX-ATT 1, the signal is attenuated, as desired, in response to the power of the signal. The attenuated signal is amplified by the PA 2, and unnecessary frequency components are eliminated from the signal by the BPF 3a. Thereafter, the signal is transmitted through the SPDT-SW 4a and the ANT 5 and output from the antenna 5a.

During reception, the SPDT-SW 4a connects the ANT 5 to the RX-OUT 14, and an RF signal received by the antenna 5a is transmitted through the ANT 5 and the SPDT-SW 4a to the RX-ATT 6. In the RX-ATT 6, the signal is attenuated, as desired, in response to the power of the signal. Then, unnecessary frequency components are eliminated from the attenuated signal by the BPF 6. Thereafter, the signal is amplified by the LNA 7 and frequency-converted by a frequency converter (not shown). Finally, the signal is output from the RX-OUT 14.

Next, the operation of the negative voltage generator (NVG) 9 will be described in reference to FIGS. 5 and 6. A signal produced by the oscillator 21 is amplified to an appropriate output amplitude in the drive circuit 22, and signals IN and $\overline{IN}$ are input to the ports 102 and 103 of the charge pump 23, respectively. In the charge pump 23, when the FET 105 is turned on and the FET 106 is turned off, a current flows through the FET 105, the capacitor 110, and the FET 107 in response to the power supply voltage $V_{DD}$, whereby electric charges are stored in the capacitor 110 so that the supply voltage port 101 side of the capacitor 110 becomes positive. When the FET 105 is turned off and the FET 106 is turned on, a current flows through the FET 106, the capacitor 109, and the FET 108, whereby electric charges are stored in the capacitor 109 so that the output port 104 side of the charge pump 23 becomes negative. The switching between the FET 105 and the FET 106 is repeated in response to the signals IN and $\overline{IN}$ from the drive circuit 22, whereby a negative voltage $V_{SS}$ is output from the output port 104. An output of about $-2V$ is obtained as the negative voltage $V_{SS}$ when the power supply voltage $V_{DD}$ is 3V. Thereafter, the negative voltage $V_{SS}$ is input to the level control circuit 24, wherein the negative voltage $V_{SS}$ is adjusted to a gate bias voltage $V_{GB}$ required for the PA 2, and the gate bias voltage $V_{GB}$ is input to the PA 2. In this first embodiment, the negative voltage $V_{SS}$ is output from the $V_{SS}$ output port 25 and applied to the low voltage port 17b of the output buffer 18b of the control logic circuit 10.

A description is given of the operation of the output buffers in reference to FIGS. 3(a) and 3(b). In the output buffer 18a (18b) shown in FIG. 3(a), when the FET 80 is turned on in response to an output buffer control signal input to the output buffer control port 93, since the FET 81 is turned on, the FET 82 is turned off, whereby the FETs 83 and 85 are turned on and the FET 84 is turned off. As a result, a low voltage input to the low voltage port 95 is output from the control signal output port 94. On the other hand, when the FET 80 is turned off in response to the output buffer control signal, since the FET 81 is turned off, the FET 82 is turned on, whereby the FETs 83 and 85 are turned off and the FET 84 is turned on. As a result, a high voltage input to the high voltage port 96 is output from the control signal output port 94.

In the output buffer 18c shown in FIG. 3(b), a circuit comprising E-FETs 81 to 85, D-FETs 87 to 89, and diodes 91a and 91b, which are similar to those shown in FIG. 3(a), is added to an output buffer similar to the output buffer shown in FIG. 3(a) and, further, an inverter comprising a D-FET 98 and an E-FET 97 is included in the added circuit. In this output buffer 18c, when the FET 80 is turned on, a low voltage is output from the control signal output port 94 and, when the FET 80 is turned off, a high voltage is output from the control signal output port 94, according to the same operation as described with respect to FIG. 3(a). Further, an inverted control signal, i.e., a signal opposite to the control signal output port 94, is output from the control signal output port 94a.

A description is given of the operation of the RX-ATT 6 with reference to FIG. 4. The RX-ATT 6 is controlled by the control signals $V_{G3}$ and $\overline{V_{G3}}$, which are opposed to each other, and input to the control signal input ports 46 and 47, respectively. First of all, since the resistors 40 to 42 are connected in parallel, the potential of drains and sources of the FETs 31 to 33 is as high as the potential of the power supply voltage $V_{DD}$. Therefore, when the control signal applied to the control signal input port 46 is a high voltage signal, i.e., "H", and the control signal applied to the control signal input port 47 is a low voltage signal, i.e., "L", the FET 31 is turned on and the FETs 32 and 33 are turned off, whereby the RF signal input to the signal input port 44 is in the transmitted state. On the other hand, when the control signal input to the control signal input port 46 is "L" and the control signal input to the control signal input port 47 is "H", the FET 31 is turned off and the FETs 32 and 33 are turned on to produce a $\pi$ resistor circuit, whereby the RF signal input to the signal input port 44 is in the attenuated state. At the transmission, i.e., when the RX-ATT 6 is not necessary, "L" and "H" are applied to the control signal input ports 46 and 47 of the RX-ATT 6 from the control logic circuit 10, respectively.

Next, the operation of the circuit shown in FIG. 2, i.e., the SPDT-SW 4a, the RX-ATT 6, and the interface part of the control logic circuit 10, will be described. In the operation, the power supply voltage $V_{DD}$ is 3V, and the negative voltage $V_{SS}$ produced by the NVG 9 is −2V.

During transmission, in response to the buffer control signals $V_{C1}$ and $V_{C2}$, a high voltage is supplied from the output buffer 18a as "H" of the control signal $V_{G1}$ and a low voltage is supplied from the output buffer 18b as "L" of the control signal $V_{G2}$. Then, the FET 70 in the transmission side switch section 4b of the SPDT-SW 4a is turned on by the high potential "H" of the control signal $V_{G1}$, and the FET 71 in the reception side switch section 4c of the SPDT-SW 4a is turned off by the low potential "L" of the control signal $V_{G2}$, whereby an RF signal input to the SW-TX 62 is output from the antenna port 5. The input RF signal is not output from the SW-RX 63.

During reception, in response to the buffer control signals $V_{C1}$ and $V_{C2}$, a low voltage is output from the output buffer 18a as "L" of the control signal $V_{G1}$ and a high voltage is output from the output buffer 18b as "H" of the control signal $V_{G2}$. Then, the FET 70 in the SPDT-SW 4a is turned off by the low potential "L" of the control signal $V_{G1}$, and the FET 71 is turned on by the high potential "H" of the control signal $V_{G2}$, whereby an RF signal input to the antenna port 5 is output from the SW-RX 63. The input RF signal is not output from the SW-TX 62.

Figure 13:
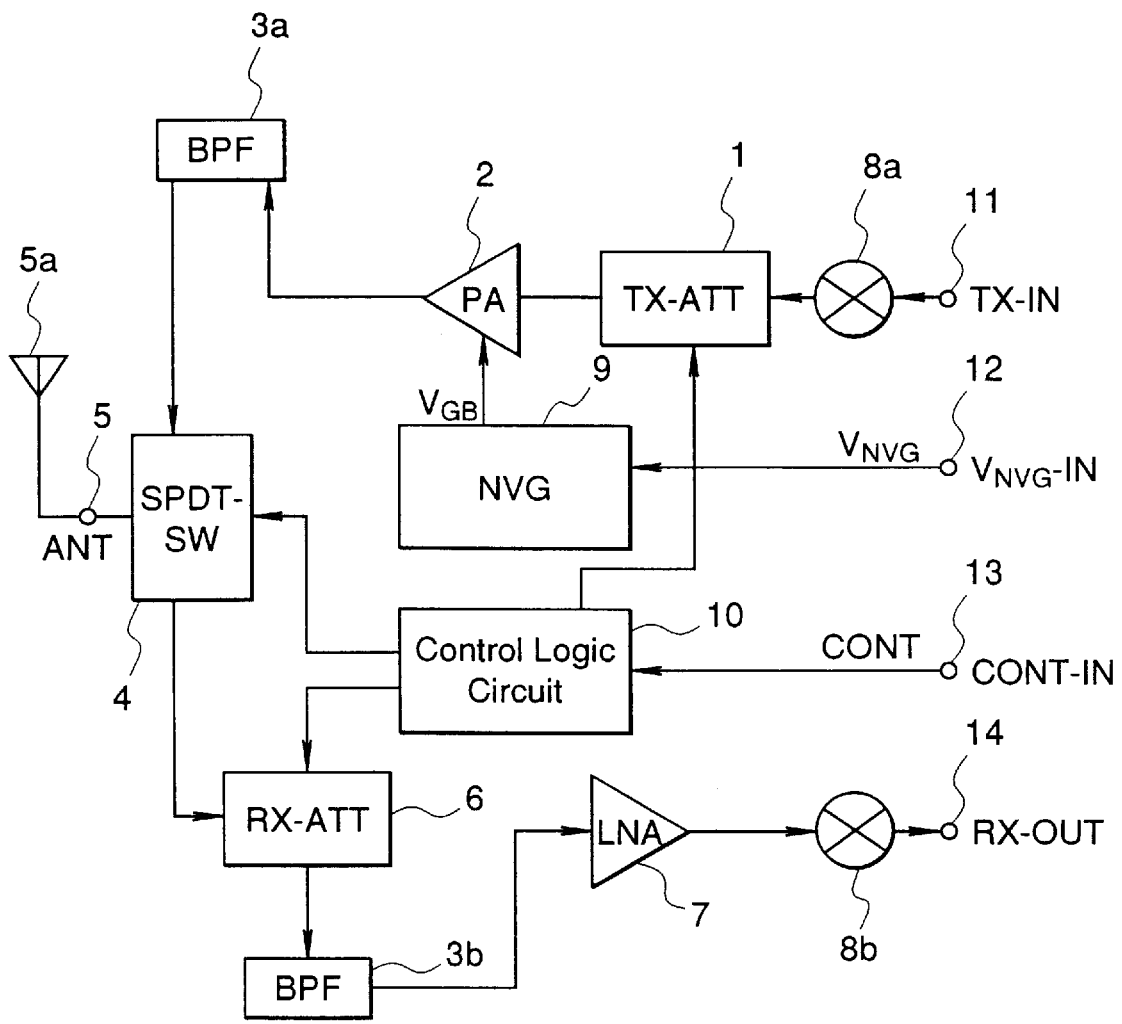
FIG. 13 is a block diagram illustrating a structure of an RF front end part of a portable telephone according to the prior art.

The output buffers 18a, 18b, and 19 have such circuit constructions that the high voltage $V_H$ input to the output buffers is output as high voltage control signals while low voltages $V_{L1}$, $V_{L2}$, and $V_{L3}$ input to the output buffers are output as low voltage control signals. In this first embodiment, the power supply voltage $V_{DD}$ (=3V) is applied to the output buffers 18a and 19 as the high voltage $V_H$ and the ground voltage (=0V) is applied to these output buffers as the low voltages $V_{L1}$ and $V_{L3}$. Further, during the transmission operation, the NVG 9 produces the negative voltage $V_{SS}$ to operate the PA 2 with the negative voltage $V_{SS}$, and this negative voltage $V_{SS}$ (=−2V) is applied to the output buffer 18b as the low voltage $V_{L2}$. Therefore, during the transmitting operation, the negative voltage $V_{SS}$ lower than the ground voltage is applied, as "L" of the control signal $V_{G2}$ from the output buffer 18b, to the gate electrode of the FET 71 to turn off the FET 71, whereby the gate to source voltage (gate to drain voltage) of the FET 71 during transmission is −5V (=$V_{SS}-V_{DD}$). In the prior art IC shown in FIG. 13, since the low voltages $V_{L1}$, $V_{L2}$, and $V_{L3}$ that decide the low level of the output buffer are grounded and the low potential "L" of the control signal is equal to the ground voltage, i.e., 0V, the gate to source voltage (gate to drain voltage) of the FET 71 when the power supply voltage $V_{DD}$ is as low as 3V is −3V (=0V−$V_{DD}$), so that the OFF state of the FET 71 is not sufficient, resulting in signal leakage that adversely affects the resistance of a part in the vicinity of the SPDT-SW 4 to the transmission voltage. In the IC according to this first embodiment, however, since the gate to source voltage of the FET 71 in the reception side switch section 4c is −5V, a sufficient OFF state of the FET 71 is realized, whereby unwanted signal leakage is avoided.

Figure 7:
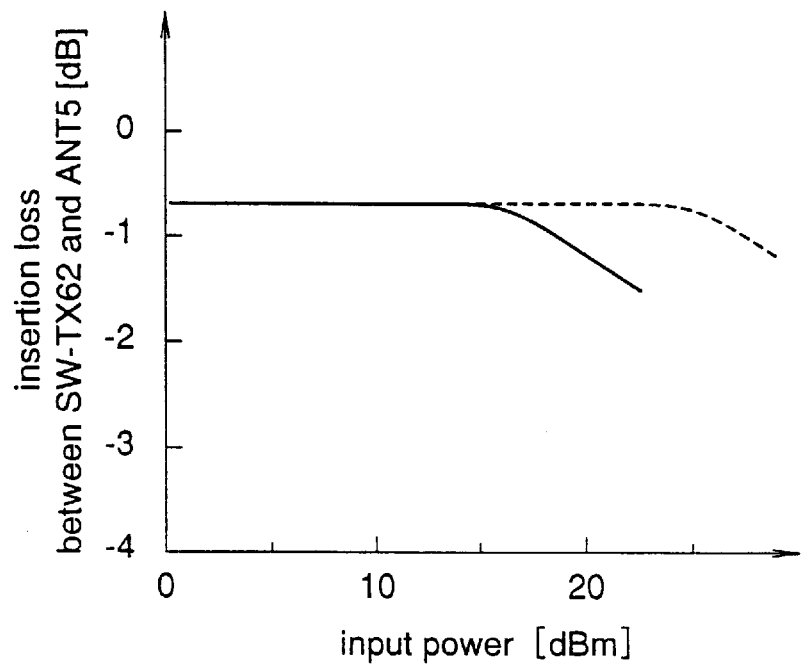
FIGS. 7(a) and 7(b) are diagrams for explaining the insertion loss and the isolation in the IC according to the first embodiment of the invention.
Figure 7:
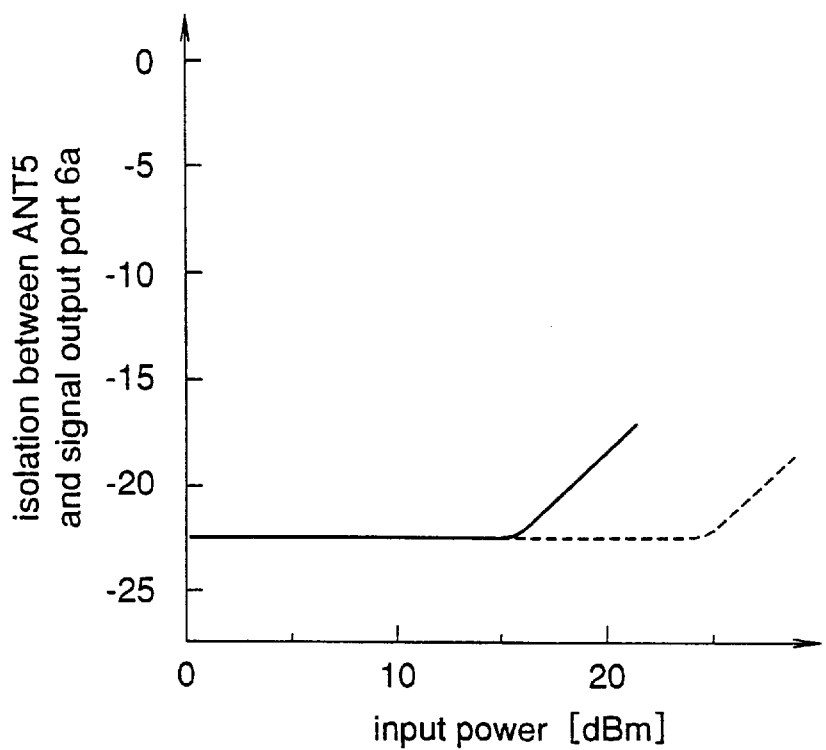

FIGS. 7(a) and 7(b) show the insertion loss characteristics between the ANT 5 and the SW-TX 62 and the isolation characteristics between the ANT 5 and the signal output port 6a of the RX-ATT 6, respectively, during the transmitting operation of the IC including the SPDT-SW 4a shown in FIG. 2. In FIG. 7(a), the ordinate shows the insertion loss (dB) between the NT 5 and the SW-TX 62, and the abscissa shows the input power (dBm) during transmission. In FIG. 7(b), the ordinate shows the isolation (dB) between the ANT 5 and the signal output port 6a of the RX-ATT 6, and the abscissa shows the input power (dBm) during transmission. In these figures, "H" of the control signal $V_{G1}$ applied to the gate electrode of the FET 70 is equal to the power supply voltage $V_{DD}$ (=3V), and the solid line shows the case where the low potential "L" input to the control voltage port 65 is 0V while the dotted line shows the case where the low potential "L" is sufficiently lower than 0V.

As shown in FIG. 7(a), when the low potential "L" of the control signal input to the control signal input port 65 is 0V, since the gate to source voltage (gate to drain voltage) of the FET 71 is insufficient, if the input power exceeds 15 dBm, the insertion loss between the SW-TX 62 and the ANT 5 increases. On the other hand, when the low potential "L" of the control signal is sufficiently lower than 0V, since the gate to source voltage (gate to drain voltage) of the FET 2 is sufficient, even though a high power over 24 dBm is input, the insertion loss between the ANT 5 in the SPDT-SW 4a and the SW-TX 62 is maintained at a low value. When the domestic personal handy phone system (PHS) is taken as an example of portable telephone system, since an output from a power amplifier is 21∼22 dBm in the PHS, the loss of the transmission power is significant when the low potential "L" of the control signal is 0V as shown by the solid line in FIG. 7(a). Therefore, an IC with the control signal "L"=0V cannot be used in the PHS.

On the other hand, as shown by the solid line in FIG. 7(b), when the low potential "L" of the control signal is 0V, the isolation between the ANT 5 in the SPDT-SW 4a and the signal output port 6a of the RX-ATT 6 decreases when the input power exceeds 15 dBm. However, as shown by the dotted line in the figure, when the low potential "L" of the control signal is sufficiently lower than 0V, the isolation is maintained even though a high transmission power over 24 dBm is input.

From FIGS. 7(a) and 7(b), it is found that a low insertion loss of the SPDT-SW 4a and a high isolation between the SPDT-SW 4a and the RX-ATT 6 are maintained when the low potential "L" of the control signal applied to the gate electrode of the FET 71 in the reception side switch section 4c of the SPDT-SW 4a is sufficiently lower than 0V. In this first embodiment of the invention, since the low potential "L" of the control signal is −2V, i.e., it is sufficiently lower than 0V, the insertion loss of the SPDT-SW 4a is reduced and the isolation between the SPDT-SW 4a and the RX-ATT 6 is improved.

As described above, according to the first embodiment of the present invention, since a voltage lower than the ground voltage is applied, as a low voltage control signal, to the gate electrode of the FET 71 in the reception side switch section 4c, the gate to source voltage (gate to drain voltage) of the FET 71 is increased, whereby the insertion loss of the SPDT-SW 4a is reduced and the isolation between the SPDT-SW 4a and the RX-ATT 6 is improved. As a result, the resistance of the IC to a high transmission power is improved.

[Embodiment 2]

Figure 8:
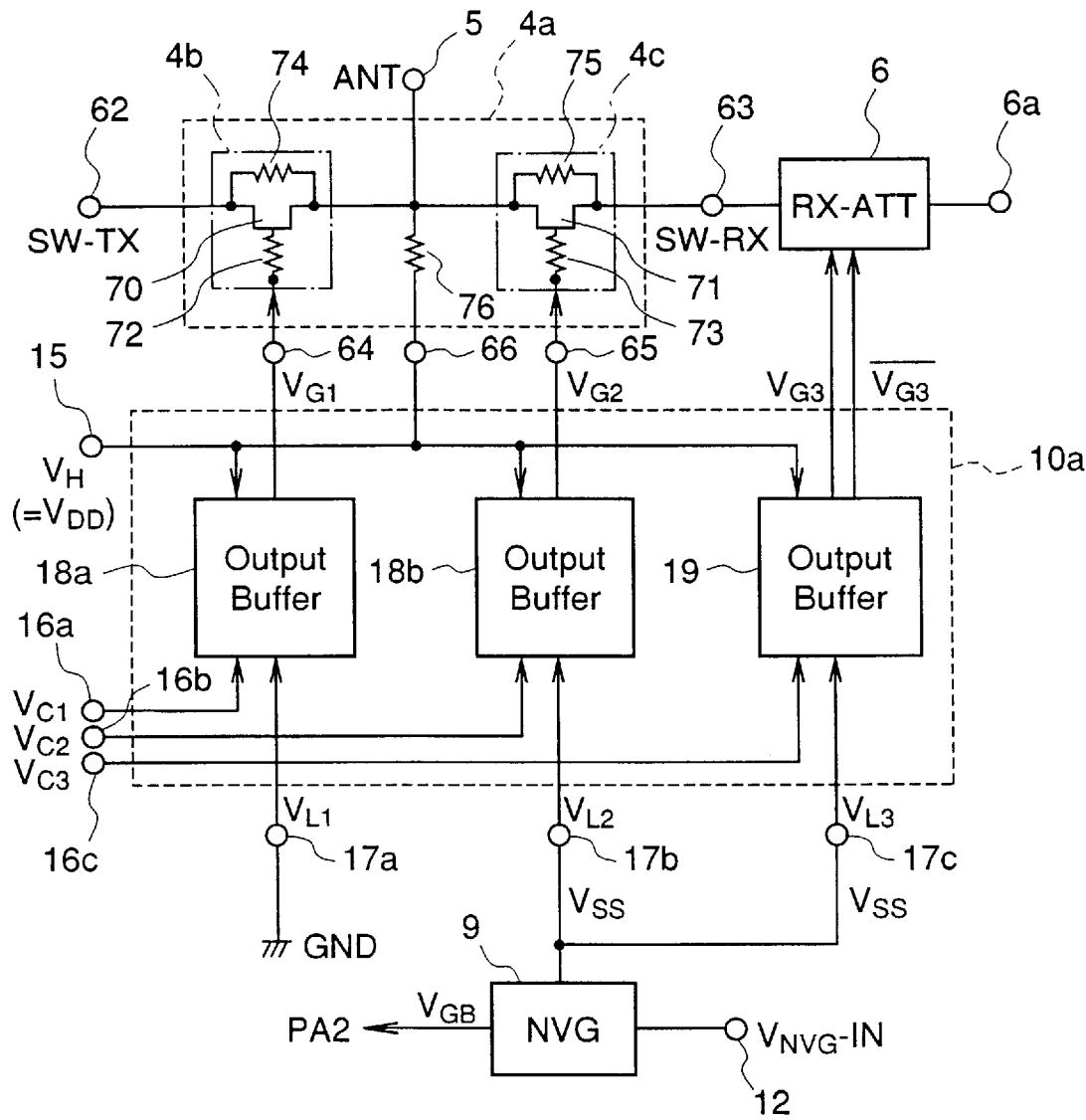
FIG. 8 is a block diagram illustrating a part of an IC according to a second embodiment of the present invention.

FIG. 8 is a block diagram illustrating a part of an IC according to a second embodiment of the present invention. In the figure, the same reference numerals as those shown in FIG. 2 designate the same or corresponding parts.

The IC according to this second embodiment is identical to the IC according to the first embodiment except that, in order to further improve the isolation between the SW-TX 62 of the SPDT-SW 4a and the output port 6a of the RX-ATT 6, the low voltage port 17c of the output buffer 19 for controlling the RX-ATT 6 is connected to the $V_{SS}$ output port 25 of the NVG 9 so that the negative voltage $V_{SS}$ produced in the NVG 9 during the transmitting operation is applied to the output buffer 19 as the low voltage $V_{L3}$.

In the RX-ATT 6 shown in FIG. 4, during transmission of an RF signal, "L" and "H" are applied to the control signal input ports 46 and 47 as the control signals $V_{G3}$ and $\overline{V_{G3}}$, respectively, whereby the FET 31 is turned off and the FETs 32 and 33 are turned on, and the RX-ATT 6 is in the attenuating state.

In this second embodiment of the invention, as shown in FIG. 8, since the negative voltage $V_{SS}$ sufficiently lower than the ground voltage is applied to the low voltage port 17c of the output buffer 19, the low potential "L" of the control signal output from the output buffer 19 is the negative voltage $V_{SS}$ at the transmission. Therefore, the control signal $V_{G3}$ applied to the gate of the FET 31 in the RX-ATT 6 is the negative voltage $V_{SS}$. When the power supply voltage $V_{DD}$ is 3V and the negative voltage $V_{SS}$ produced in the NVG 9 is -2V, since the ground potential, i.e., 0V, is used as the low potential "L" in the prior art IC, potentials of transmission lines in the RX-ATT 6 are raised to the potential of the power supply voltage $V_{DD}$, whereby the gate to source voltage (gate to drain voltage) of the FET 31 is -3V (=0V-$V_{DD}$). In this second embodiment, however, the gate to source voltage (gate to drain voltage) of the FET 31 can be increased to -5V (=$V_{SS}$-$V_{DD}$).

In the prior art IC, since the OFF state of the FET 31 is not sufficient, a signal leaking out of the SPDT-SW 4a during transmission flows through the FET 31, so that it is difficult to maintain a high isolation. In this second embodiment of the invention, however, since the OFF state of the FET 31 is sufficient, a signal leaking out of the SPDT-SW 4a and traveling into the RX-ATT 6 is cut off by the FET 31, whereby satisfactory isolation between the SW-TX 62 and the signal output port 6a of the RX-ATT 6 is maintained against a high transmission power.

[Embodiment 3]

Figure 9:
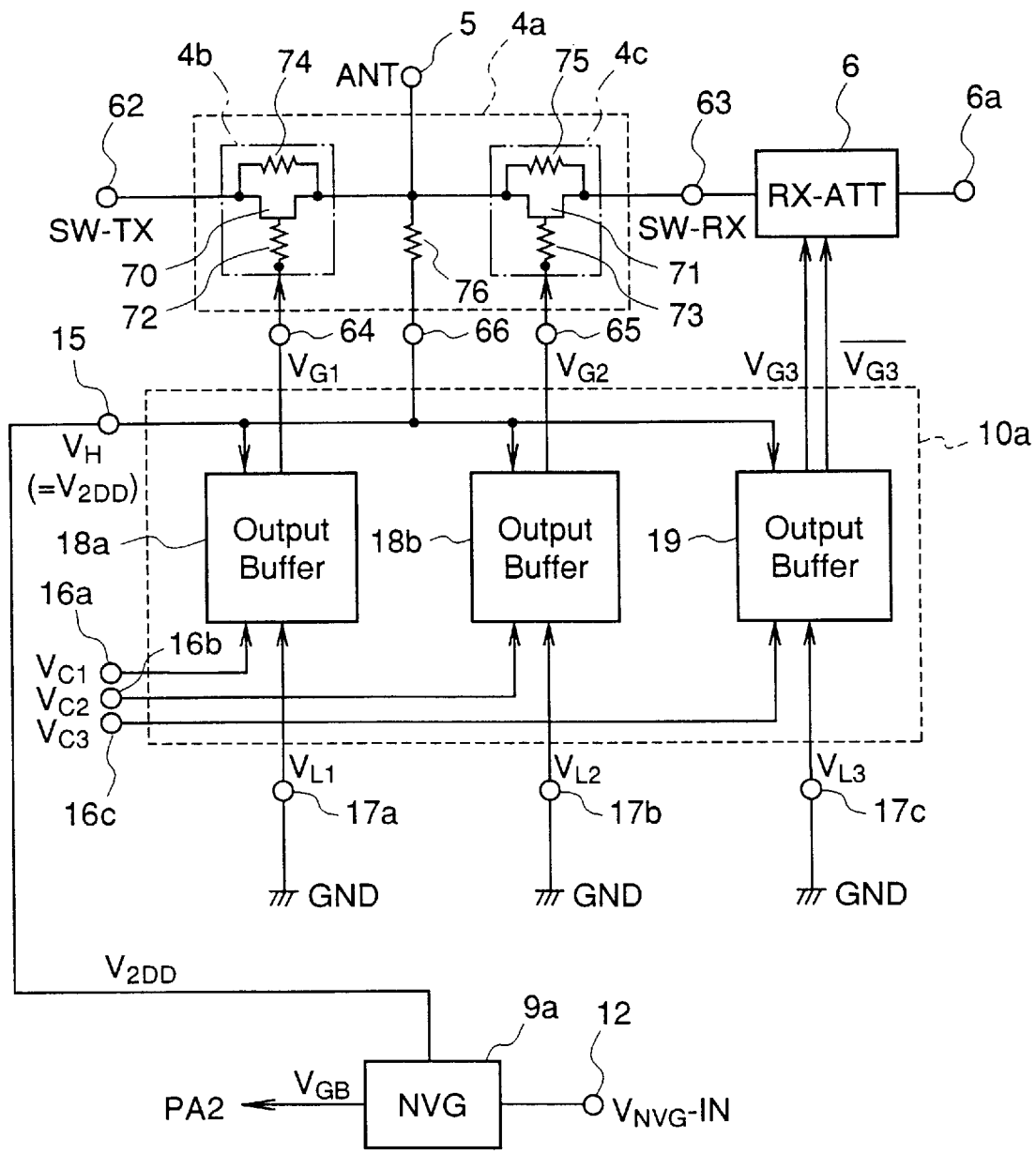
FIG. 9 is a block diagram illustrating a part of an IC according to a third embodiment of the present invention.

FIG. 9 is a block diagram illustrating a part of an IC in accordance with a third embodiment of the present invention. In the figure, the same reference numerals as those shown in FIG. 2 designate the same or corresponding parts. The IC according to this third embodiment employs a negative voltage generator 9a including a double voltage generator (hereinafter referred to as a double voltage/negative voltage generator) in place of the NVG 9 according to the first embodiment. The double voltage generator generates an output voltage twice as high as the power supply voltage $V_{DD}$ (hereinafter referred to as a double voltage $V_{2DD}$). A negative voltage $V_{GB}$ produced in this circuit 9a is applied to the PA 2, and the double voltage $V_{2DD}$ is applied to the high voltage port 15 for supplying a high voltage to the SPDT-SW 4a and the output buffers 18a, 18b, and 19. The low voltage port 17b of the output buffer 18b is grounded.

Figure 10:
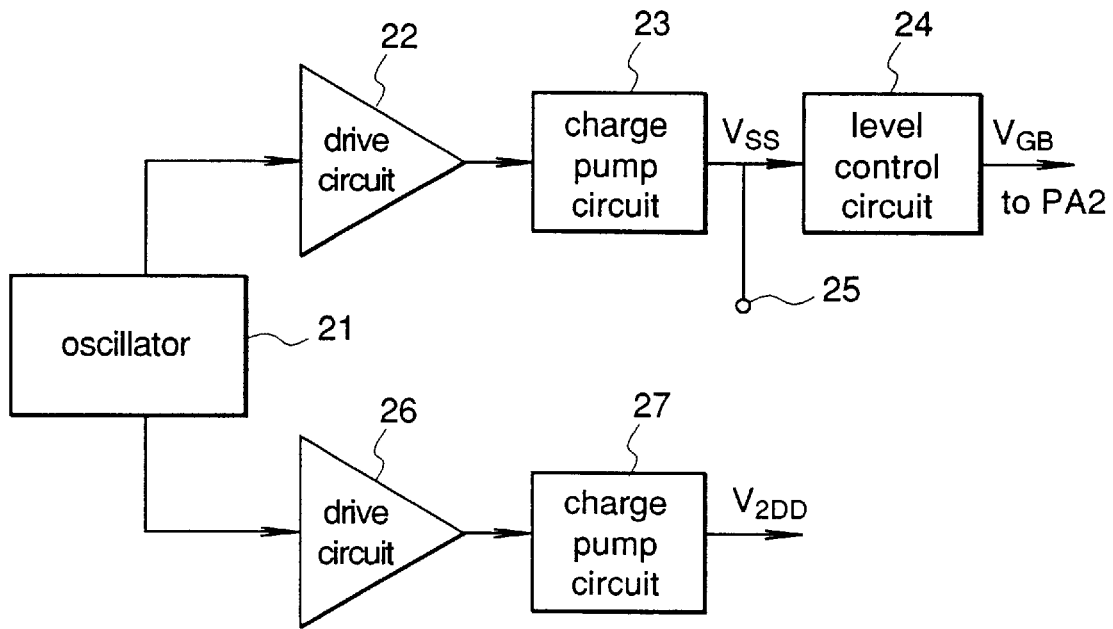
FIG. 10 is a block diagram illustrating a structure of a double voltage/negative voltage generator included in the IC according to the third embodiment of the invention.

FIG. 10 is a block diagram illustrating the double voltage/negative voltage generator 9a. In the figure, the same reference numerals as those shown in FIG. 5 designate the same or corresponding parts. Reference numeral 26 designates a drive circuit on the double voltage output side, and reference numeral 27 designates a double voltage generating charge pump circuit. Although it is not shown in the figure, the power supply voltage $V_{DD}$ is applied to the drive circuit 26 and the charge pump circuit 27.

Figure 11:
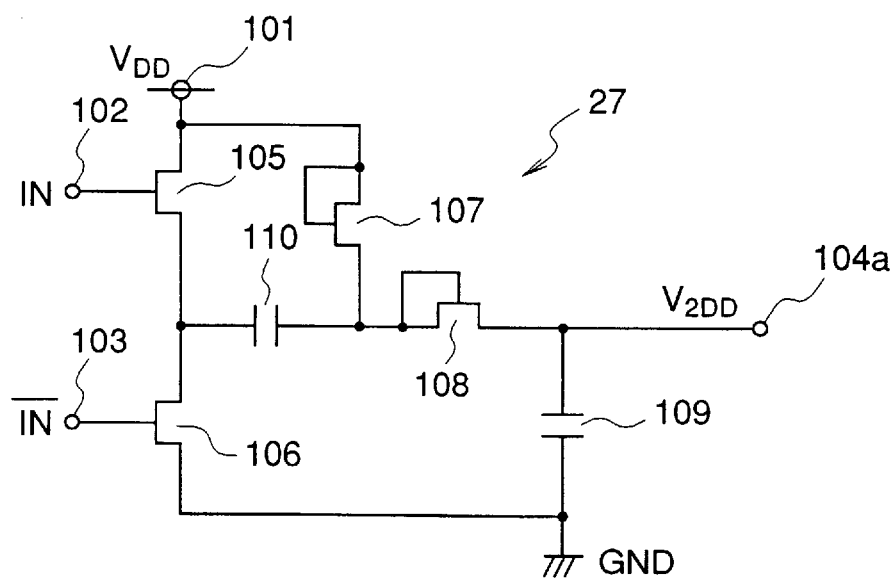
FIG. 11 is a circuit diagram illustrating a structure of a double voltage generating charge pump included in the IC according to the third embodiment of the invention.

FIG. 11 is a circuit diagram illustrating the double voltage generating charge pump circuit 27. In the figure, the same reference numerals as those shown in FIG. 6 designate the same or corresponding parts. Reference numeral 104a designates a double voltage $V_{2DD}$ output port. The input ports 102 and 103 are connected to the output of the drive circuit 26. A signal IN and an inverted signal $\overline{IN}$ are applied to the input ports 102 and 103, respectively.

In the double voltage/negative voltage generator 9a, a negative voltage $V_{SS}$ is produced by the oscillator 21, the drive circuit 22, the charge pump circuit 23, and the level control circuit 24, as in the negative voltage generator shown in FIG. 5. In addition, a double voltage $V_{2DD}$ is produced by the oscillator 21, the drive circuit 26, and the double voltage generating charge pump circuit 27.

In the double voltage generating charge pump circuit 27, when the FET 105 is turned off and the FET 106 is turned on by the input signals IN and $\overline{IN}$ which are produced by amplification of an output signal from the oscillator 21 in the drive circuit 26, a current flows through the FET 107, the capacitor 110, and the FET 106 in response to the power supply voltage $V_{DD}$ from the supply voltage port 101, whereby electrical charge producing a voltage equivalent to the power supply voltage is stored in the capacitor 110 so that the FET 107 side becomes positive. When the FET 105 is turned on and the FET 106 is turned off by inversion of the input signals, since the potential of the FET 105 is equal to the potential of the FET 107, a current flows from the supply voltage port 101 through the FET 107, the FET 108, and the capacitor 109, whereby electrical charge producing a voltage equivalent to the power supply voltage is stored in the capacitor 109 so that the FET 108 side becomes positive. The switching between the FET 105 and the FET 106 is repeated to output a double voltage $V_{2DD}$ about twice as high as the power supply voltage $V_{DD}$ from the double voltage output port 104a. The circuit structure of the double voltage generating charge pump circuit 27 is not restricted to the circuit structure shown in FIG. 11.

In the first embodiment of the invention, a negative voltage $V_{SS}$ produced in the NVG 9 is applied, as a low voltage, to the output buffer 18b for supplying a control signal to the transmission side switch section 9c of the SPDT-SW 4a to increase the gate to source voltage (gate to drain voltage) of the FET 71 in the SPDT-SW 4a, which is in the OFF state during transmission, whereby a reduction in the insertion loss of the SPDT-SW 4a and an increase in the isolation between the SPDT-SW 4a and the RX-ATT 6 are realized. On the other hand, in this third embodiment of the invention, the double voltage/negative voltage generator 9a shown in FIG. 10 is employed in place of the NVG 9, and a voltage for raising potentials of transmission lines in the SPDT-SW 4a during transmission is increased to a voltage $V_{2DD}$ about twice as high as the power supply voltage $V_{DD}$ within the IC 100 using the double voltage/negative voltage generator 9a. For example, when $V_{DD}$ is 3V, $V_{2DD}$ is 5~6V. Also in this case, the same effects as provided by the first embodiment are realized.

Turning to FIG. 9, the double voltage $V_{2DD}$ output from the double voltage/negative voltage generator 9a is applied, as a high voltage $V_H$, to the high voltage port 15, and the low voltage port 17b of the output buffer 18b is grounded, whereby, during transmission, potentials of transmission lines in the SPDT-SW 4a are made equal to the double voltage $V_{2DD}$ while the low potential "L" of the control signal applied to the gate electrode of the FET 71 in the transmission side switch section 4c is made equal to the ground voltage, i.e., 0V. Thereby, the gate to source voltage (gate to drain voltage) of the FET 71 in the transmission side switch section 4c, which is in the OFF state during transmission, is increased to −5~−6V (=0V−$V_{2DD}$) whereas it is −3V (=0V−$V_{DD}$) in the prior art IC. Although the double voltage $V_{2DD}$ is applied to the high voltage port 15 as a high voltage $V_H$ in the circuit shown in FIG. 9, it may be directly applied to the source and drain of the FET 71 in the transmission side switch section 4c.

As described above, according to the third embodiment of the invention, since the double voltage $V_{SS}$ produced in the double voltage/negative voltage generator 9a is applied to the transmission lines in the SPDT-SW 4a, the gate to source voltage (gate to drain voltage) of the FET 71 which is in the OFF state during transmission can be made higher than that provided in the prior art IC, whereby the same effects as provided by the first embodiment of the invention are achieved.

[Embodiment 4]

Figure 12:
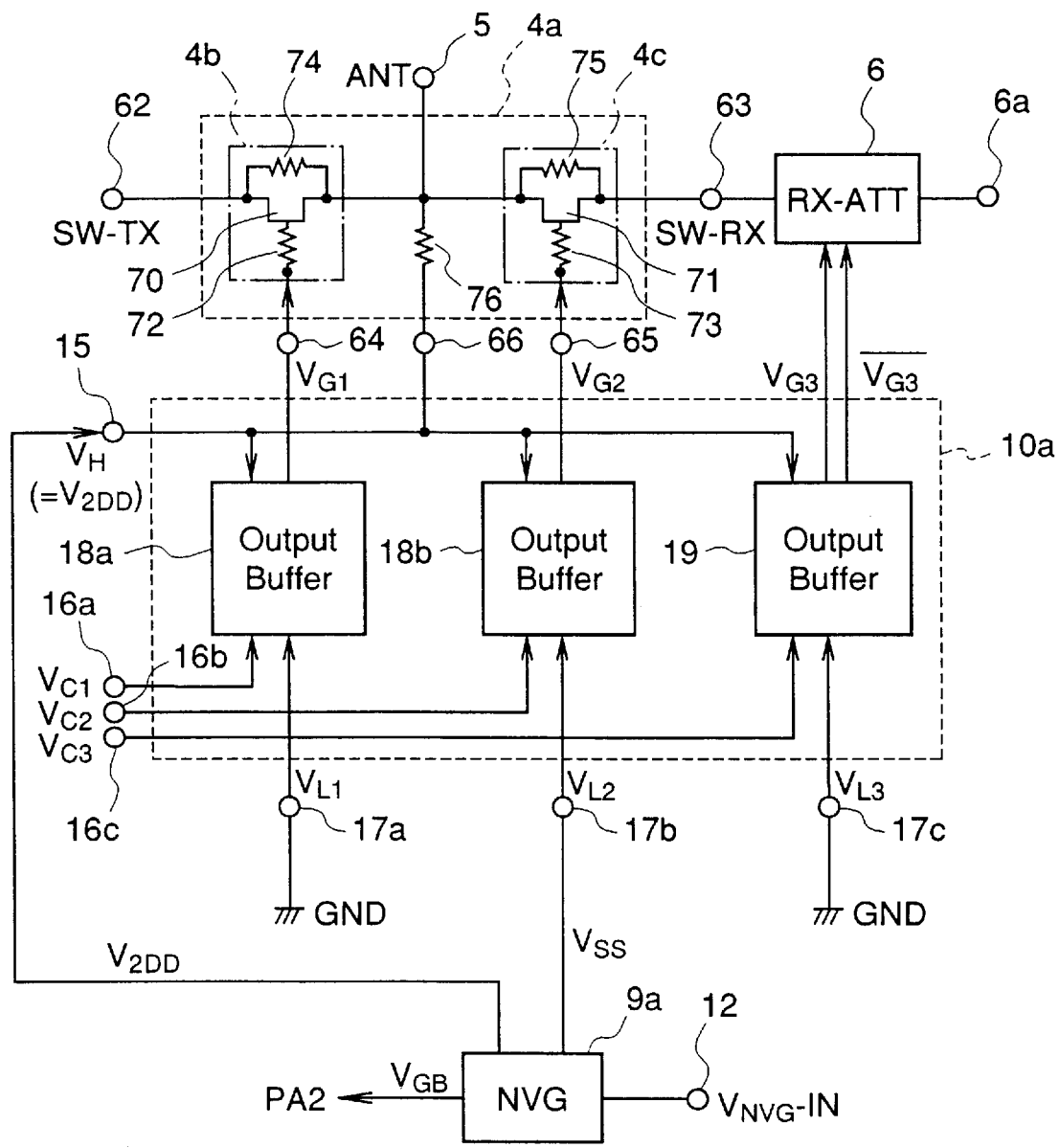
FIG. 12 is a block diagram illustrating a part of an IC according to a fourth embodiment of the present invention.

FIG. 12 is a block diagram illustrating a part of an IC according to a fourth embodiment of the invention. In the figure, the same reference numerals as those shown in FIG. 9 designate the same or corresponding parts.

In this fourth embodiment of the invention, in an IC similar to the IC according to the third embodiment, the low voltage port 17b of the output buffer 18b is connected to the negative voltage $V_{SS}$ output port 25 of the double voltage/negative voltage generator 9a whereas it is grounded in the third embodiment, so that the negative voltage $V_{SS}$ output from the charge pump circuit 23 is applied to the output buffer 18b as a low voltage $V_{L2}$. In this circuit, since the low potential "L" of the control signal output from the output buffer 18b during transmission is equal to the negative voltage $V_{SS}$, when the power supply voltage $V_{DD}$ is 3V and the negative voltage $V_{SS}$ is −2V, the gate to source voltage (gate to drain voltage) of the FET 71 in the SPDT-SW 4a, which is in the OFF state during transmission, is increased to −7~−8V (=$V_{SS}$−$V_{2DD}$), that is, a further increase in the gate to source voltage is realized. As a result, a further reduction in the insertion loss of the SPDT-SW 4a and a further increase in the isolation between the SPDT-SW 4a and the RX-ATT 6 are achieved as compared with those achieved in the IC according to the third embodiment.

Figure 14:
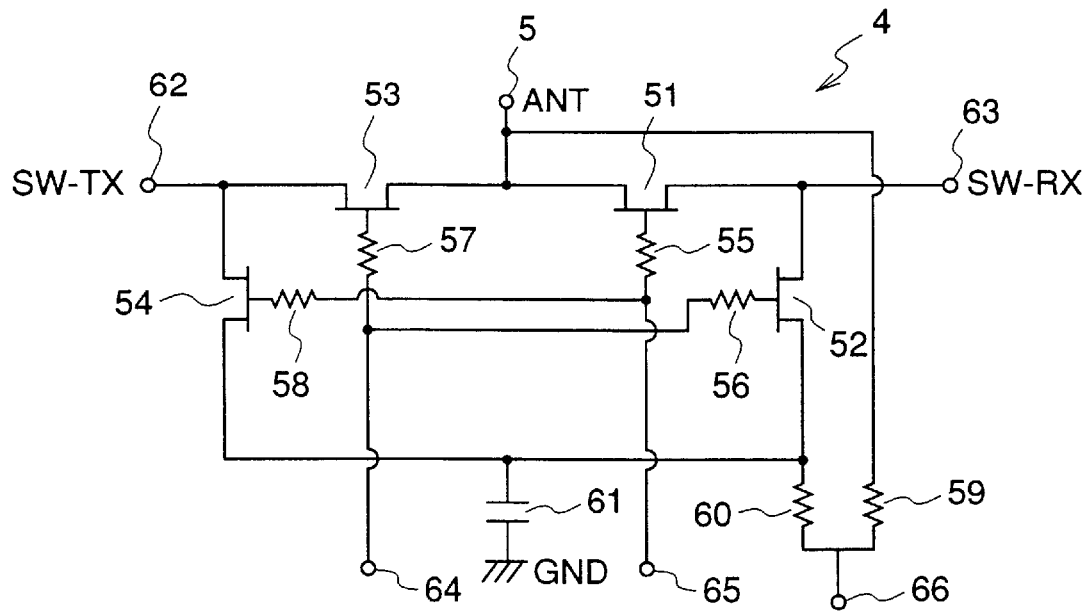
FIG. 14 is a circuit diagram illustrating a structure of an SPDT switch according to the prior art.
Figure 15:
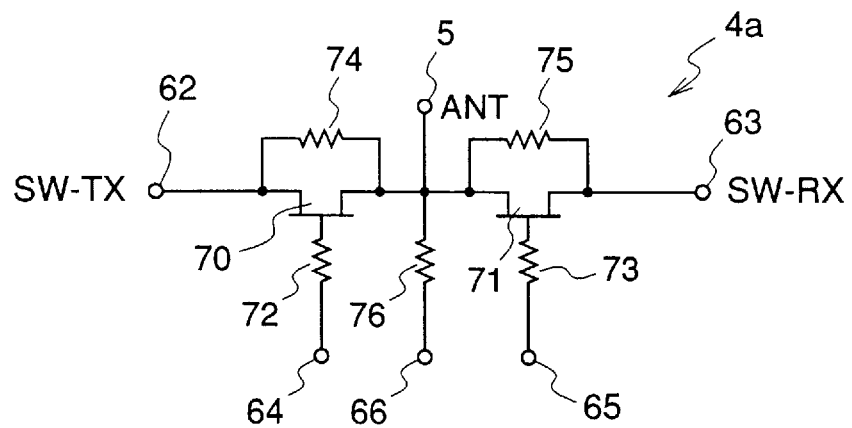
FIG. 15 is a circuit diagram illustrating an SPDT switch according to the prior art.

In the first to fourth embodiments of the present invention, emphasis has been placed upon an IC including an SPDT switch 4a having a simple structure wherein each of a transmission side switch section 4b and a reception side switch section 4c comprises a single FET, as shown in FIG. 2. However, a similar IC including an SPDT switch wherein a transmission side switch section or a reception side switch section comprises a plurality of transistors switching signals ON and OFF or an SPDT switch similar to the conventional SPDT switch shown in FIG. 14 is within the scope of the invention. Also in this case, the same effects as provided by the first to fourth embodiments of the invention are achieved by increasing the gate to drain voltage (gate to source voltage) of the transistor in the reception side switch section that is in the OFF state during transmission.

What is claimed is:

1. An integrated circuit including:
   an SPDT (Single Pole Double Throw) switch comprising:
   a transmitting and receiving port, a transmitting port, and a receiving port,
   a transmission switch coupled between the transmitting port and the transmitting and receiving port, the transmission switch including a first field effect transistor having a gate and conducting current between the transmitting port and the transmitting and receiving port in response to a first control signal having a voltage substantially equal to a first power supply voltage applied to the gate of the first field effect transistor, and
   a reception switch coupled between the receiving port and the transmitting and receiving port, the reception switch including a second field effect transistor having a gate, a drain, and a source and conducting current between the receiving port and the transmitting and receiving port in response to a second control signal having a voltage substantially equal to the first power supply voltage applied to the gate of the second field effect transistor; and
   voltage generating means, receiving the first power supply voltage and receiving a second power supply voltage lower than the first power supply voltage, for generating a third voltage lower than the second power supply voltage, and applying the third voltage to the gate of the second field effect transistor when the first power supply voltage is applied to the gate of the first field effect transistor.

2. An integrated circuit comprising:
   an SPDT (Single Pole Double Throw) switch comprising:
   a transmitting and receiving port, a transmitting port, and a receiving port,
   a transmission switch coupled between the transmitting port and the transmitting and receiving port, the transmission switch including a first field effect transistor having a gate and conducting current between the transmitting port and the transmitting and receiving port in response to a first control signal having a voltage substantially equal to a positive power supply voltage applied to the gate of the first field effect transistor, and
   a reception switch coupled between the receiving port and the transmitting and receiving port, the reception switch including a second field effect transistor having a gate, and conducting current between the receiving port and the transmitting and receiving port in response to second control signal having a voltage substantially equal to the positive power supply voltage applied to the gate of the second field effect transistor;
   means for applying a voltage lower than ground voltage to the gate of the second field effect transistor when the positive power supply voltage is applied to the gate of the first field effect transistor;
   a reception attenuator including a third field effect transistor having a gate and connected to the receiving port of the SPDT switch, the reception attenuator being in a non-attenuating state when a third control signal having a voltage substantially equal to the positive power supply voltage is applied to the gate of the third field effect transistor and in an attenuating state when a voltage lower than the positive power supply voltage is applied to the gate of the third field effect transistor; and
   means for applying the voltage lower than the ground voltage to the gate of the third field effect transistor to produce the attenuating state of the reception attenuator when the positive power supply voltage is applied to the gate of the first field effect transistor.

3. An integrated circuit including:
   an SPDT (Single Pole Double Throw) switch comprising:
   a transmitting and receiving port, a transmitting port, and a receiving port,
   a transmission switch coupled between the transmitting port and the transmitting and receiving port, the transmission switch including a first field effect transistor having a gate and conducting current between the transmitting port and the transmitting and receiving port in response to a first control signal having a voltage substantially equal to a positive power supply voltage applied to the gate of the first field effect transistor, and a reception switch coupled between the receiving port and the transmitting and receiving port, the reception switch including a second field effect transistor having a gate, a source, and a drain, and conducting current between the receiving port and the transmitting and receiving port in response to a second control signal having a voltage substantially equal to the positive power supply voltage applied to the gate of the second field effect transistor; and means for applying ground voltage to the gate of the second field effect transistor and applying a voltage higher than the positive power supply voltage to the source and the drain of the second field effect transistor when the first field effect transistor is conducting.

4. An integrated circuit including:

an SPDT (Single Pole Double Throw) switch comprising:

a transmitting and receiving port, a transmitting port, and a receiving port, a transmission switch coupled between the transmitting port and the transmitting and receiving port, the transmission switch including a first field effect transistor having a gate and conducting current between the transmitting port and the transmitting and receiving port in response to a first control signal having a voltage substantially equal to a positive power supply voltage applied to the gate of the first field effect transistor, and a reception switch coupled between the receiving port and the transmitting and receiving port, the reception switch including a second field effect transistor having a gate, a source, and a drain, and conducting current between the receiving port and the transmitting and receiving port in response to a second control signal having a voltage substantially equal to the positive power supply voltage applied to the gate of the second field effect transistor; and means for applying a voltage lower than ground voltage to the gate of the second field effect transistor and applying a voltage higher than the positive power supply voltage to the source and the drain of the second field effect transistor when the first field effect transistor is conducting.

5. The integrated circuit of claim 3 wherein the means for applying includes a voltage doubling circuit for producing the voltage higher than the positive power supply voltage.

6. The integrated circuit of claim 4 wherein the means for applying includes a voltage doubling circuit for producing the voltage higher than the positive power supply voltage.

7. The integrated circuit according to claim 1 wherein the voltage generating means comprises:

an oscillator;

a drive circuit coupled to the oscillator for generating a drive signal and an inverted drive signal;

a charge pump circuit, coupled to the drive circuit, for generating the third voltage in response to the inverted drive signal.

8. The integrated circuit of claim 1 wherein, during transmission, a voltage difference between the gate of the second field effect transistor and the source of the second field effect transistor is greater in magnitude than a voltage difference between the first and second power supply voltages.

* * * * *